(12) United States Patent
Kasahara et al.

(10) Patent No.: US 9,159,898 B2
(45) Date of Patent: Oct. 13, 2015

(54) OXIDE SUPERCONDUCTOR THIN FILM AND SUPERCONDUCTING FAULT CURRENT LIMITER

(75) Inventors: Hajime Kasahara, Tokyo (JP); Norio Matsui, Tokyo (JP); Masakazu Matsui, Tokyo (JP); Naoto Edo, Tokyo (JP); Kengo Nakao, Tokyo (JP); Toshiya Kumagai, Ibaraki (JP); Takaaki Manabe, Ibaraki (JP); Mitsugu Sohma, Ibaraki (JP)

(73) Assignees: FURUKAWA ELECTRIC CO., LTD., Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 49 days.

(21) Appl. No.: 14/123,083

(22) PCT Filed: May 31, 2012

(86) PCT No.: PCT/JP2012/064123
§ 371 (c)(1),
(2), (4) Date: Nov. 27, 2013

(87) PCT Pub. No.: WO2012/165563
PCT Pub. Date: Dec. 6, 2012

(65) Prior Publication Data
US 2014/0087951 A1    Mar. 27, 2014

(30) Foreign Application Priority Data
May 31, 2011   (JP) .................................. 2011-122220

(51) Int. Cl.
*H01L 39/00* (2006.01)
*H01L 39/12* (2006.01)
(Continued)

(52) U.S. Cl.
CPC .............. *H01L 39/128* (2013.01); *C01G 3/006* (2013.01); *H01L 39/16* (2013.01); *H01L 39/2461* (2013.01); *Y10T 428/24355* (2015.01)

(58) Field of Classification Search
CPC ... H01L 39/126; H01L 39/128; H01L 39/143; H01L 39/16; H01L 39/2454; H01L 39/2458; H01L 39/2461; H01B 12/06; H02H 9/023; C01G 3/006; C30B 29/16; C30B 29/22; C30B 29/225; C04B 35/45; C04B 35/4504; C04B 35/4508
USPC .......... 505/163, 210, 230, 237–238, 704, 850, 505/866; 361/19, 93.9, 141; 428/701, 702; 427/62, 595, 596; 174/125.1; 117/98, 117/101, 103
See application file for complete search history.

(56) References Cited

U.S. PATENT DOCUMENTS

| | | | | |
|---|---|---|---|---|
| 5,262,394 | A | * 11/1993 | Wu et al. | ........................ 505/237 |
| 2005/0217568 | A1 | 10/2005 | Rupich et al. | |
| 2010/0298150 | A1 | * 11/2010 | Deutscher et al. | ............ 505/234 |

FOREIGN PATENT DOCUMENTS

| | | |
|---|---|---|
| JP | H06-56581 | 3/1994 |
| JP | 2002-150855 | 5/2002 |

(Continued)

OTHER PUBLICATIONS

Wang et al, " Annealing effects of sapphire substrate on properties of ZnO films grown by magnetron sputtering" Appl. Phys. A 88, 727-729 (2007).*

(Continued)

*Primary Examiner* — Colleen Dunn
(74) *Attorney, Agent, or Firm* — Amin, Turocy & Watson, LLP

(57) ABSTRACT

An oxide superconducting thin film includes a substrate, and an intermediate layer and a superconducting layer provided in this order on the substrate. The intermediate layer has an average thickness of from 10 nm to 20 nm and a surface roughness Ra of 0.5 nm or less. The superconducting layer is formed on a surface of the intermediate layer and includes an oxide superconductor as a main component. A superconducting fault current limiter including the oxide superconducting thin film is also provided.

16 Claims, 6 Drawing Sheets

(51) Int. Cl.
*H01L 39/16* (2006.01)
*H01L 39/24* (2006.01)
*C01G 3/00* (2006.01)

(56) References Cited

FOREIGN PATENT DOCUMENTS

| JP | 2003-37304 | 2/2003 | | |
|---|---|---|---|---|
| JP | 2003-188427 | 7/2003 | | |
| JP | 2003-526905 | 9/2003 | | |
| JP | 2004-244263 | 9/2004 | | |
| JP | 2006-027958 | 2/2006 | | |
| JP | 2007-311194 | 11/2007 | | |
| JP | 2008140789 | * | 6/2008 | ............. H01L 39/24 |
| KR | WO 01/05726 | * | 1/2001 | ............. H01L 39/24 |
| WO | 01/08232 | 2/2001 | | |

OTHER PUBLICATIONS

International Search Report for PCT Application Serial No. PCT/JP2012/064123, mailed Aug. 14, 2012, 2 pages.

Extended European Search Report dated Dec. 11, 2014 for European Application Serial No. 12792464.5, 5 pages.

* cited by examiner

OXIDE SUPERCONDUCTOR THIN FILM AND SUPERCONDUCTING FAULT CURRENT LIMITER

CROSS-REFERENCE TO RELATED APPLICATIONS

This application is a U.S. National Stage of PCT Patent Application No. PCT/JP2012/064123, filed May 31, 2012 and entitled "OXIDE SUPERCONDUCTOR THIN FILM AND SUPERCONDUCTING FAULT CURRENT LIMITER"; which claims priority to Japanese Patent Application No. 2011-122220, filed May 31, 2011. The entireties of the above-referenced applications are incorporated herein by reference.

TECHNICAL FIELD

The present invention relates to an oxide superconducting thin film and a superconducting fault current limiter.

BACKGROUND ART

There is a method of obtaining an oxide superconducting thin film by depositing an oxide superconductor on a substrate, which is a conventional technique for putting an oxide superconducting material to practical use.

For example, RE-based superconductors (RE: rare earth element), which exhibit a superconducting phenomenon at liquid nitrogen temperature (77 K) or higher, particularly yttrium-based superconductors (hereinafter referred to as "YBCO") represented by a composition formula of $YBa_2Cu_3O_{7-\delta}$, are often used as the oxide superconductor to be deposited.

Oxide superconducting thin films using the RE-based superconductors are expected to be applied to superconducting fault current limiters, cables, and superconducting magnetic energy storages (SMES), and RE-based superconductors and manufacturing methods thereof have drawn a lot of attention.

However, obstacles to practicalization of oxide superconducting materials, including the RE-based superconductors (particularly, oxide superconducting thin films), include difficulty in improving the critical current density characteristics (hereinafter simply referred to as "Jc characteristics").

For example, the practicalization of superconducting fault current limiters using oxide superconducting thin films requires that a largest possible electric current flow with a resistance of zero, which in turn requires that the Jc characteristics of the oxide superconducting thin films be improved.

Japanese Patent Application Laid-Open (JP-A) No. 2003-37304 discloses a method of manufacturing an oxide superconducting thin film on a sapphire substrate. It is disclosed that, in this method, a $CeO_2$ buffer layer is formed on a sapphire substrate having an R-plane, and then an inclined layer of $LaAlO_3$ is formed on the $CeO_2$ buffer layer, and then an EBCO thin film is formed on the inclined layer, whereby a lattice mismatch between the oxide superconducting thin film and the buffer layer can be alleviated.

In addition, JP-A No. 2002-150855 discloses a superconductor wire rod that includes an oxide buffer layer formed on a surface of a polycrystalline metallic base having a texture oriented in {100}<001> direction, and an oxide superconducting layer formed on the oxide buffer layer, the oxide buffer layer being composed of two layers. A first oxide buffer layer in the oxide buffer layer is a surface oxide layer of the polycrystalline metallic base, and has a surface roughness in terms of Rmax of 0.15 μm or less, and a second oxide buffer layer is formed on the first oxide buffer layer. It is disclosed that, since the oxide buffer layer is composed of these two layers, an oxide superconducting film having stable crystal properties over the entire length in the longitudinal direction thereof can be realized.

Further, JP-A No. 2003-188427 discloses a superconducting element that includes first and second oxide superconducting layers formed on a substrate and forming a Josephson junction, and an oxide interlayer insulating layer formed between wiring portions of the first and second oxide superconducting layers and expressed by $(Ca_{1-x}Sr_x)Sn_yO_z$ (wherein $0 \leq x \leq 0.8$, $0.4 \leq y \leq 1.1$, and $1.6 \leq z \leq 3.4$). In the superconductive element disclosed therein, the oxide interlayer insulating film has a thickness of about 300 nm or more and a relative permittivity $\epsilon_r$ of 40 or lower at operating temperatures of about 40 K or lower, and the oxide interlayer insulating film is capable of flat epitaxial growth with the oxide superconducting layer. The superconducting element has a small wiring capacity, and is suitable for high-speed operation.

SUMMARY OF INVENTION

Technical Problem

In oxide superconducting thin films having a substrate, an intermediate layer, and a superconducting layer, there is a tendency that a decrease in the thickness of the intermediate layer provides an improvement in Jc characteristics. However, there were cases in which, with an average thickness of the intermediate layer as thin as 20 nm or less, the intermediate layer 134 shaped into a large number of small agglomerates having island-like appearance when a superconducting layer 136 was further formed on the surface of the intermediate layer 134 as shown in FIG. 4B after the intermediate layer 134 was formed on a substrate 132 as shown in FIG. 4A. The shaping of the intermediate layer 134 into islands caused formation of holes 138 in the intermediate layer 134, which reached the substrate, and caused the superconducting layer 136 and the substrate 132 to react with each other through the holes 138, as a result of which the Jc characteristics of the oxide superconducting thin film were greatly decreased.

The present invention has been made in view of these circumstances, and aims to provide an oxide superconducting thin film having favorable Jc characteristics even with an average thickness of an intermediate layer of 20 nm or less, and a superconducting fault current limiter that includes the oxide superconducting thin film.

Solution to Problem

The problem of the present invention has been solved by the following means.

<1> An oxide superconducting thin film, including a substrate, and an intermediate layer and a superconducting layer provided in this order on the substrate, the intermediate layer having an average thickness of from 10 nm to 20 nm and a surface roughness Ra of 0.5 nm or less, and the superconducting layer being formed on a surface of the intermediate layer and including an oxide superconductor as a main component.

<2> The oxide superconducting thin film according to <1>, wherein the intermediate layer includes $CeO_2$, and an average value of a valence of the Ce element as weighed by abundance is from 3.7 to 3.95.

<3> The oxide superconducting thin film according to <1>, wherein the intermediate layer includes MgO having an NaCl-type crystal structure, and an average value of a valence of the Mg element as weighed by abundance is from 1.85 to 1.95.

<4> The oxide superconducting thin film according to any one of <1> to <3>, wherein the intermediate layer is provided on a surface of the substrate, and the substrate includes, at an interface between the substrate and the intermediate layer, a portion in which dislocation occurs.

<5> The oxide superconducting thin film according to any one of <1> to <4>, wherein the oxide superconductor is represented by a compositional formula $REBa_2Cu_3O_{7-\delta}$, wherein RE represents a single rare earth element or plural rare earth elements, and δ represents an oxygen non-stoichiometric amount.

<6> The oxide superconducting thin film according to any one of <1> to <5>, wherein the substrate is a sapphire substrate.

<7> A superconducting fault current limiter, including:
a sealed container into which liquid nitrogen is filled into;
an electric current in/out unit through which an electric current flows from outside the sealed container to inside the sealed container or from inside the sealed container to outside the sealed container; and
a superconducting fault current limiting element including the superconducting layer of the oxide superconducting thin film of any one of <1> to <6> and electrodes formed on the superconducting layer, the superconducting fault current limiting element being connected to the electric current in/out unit in the sealed container.

Advantageous Effects of Invention

According to the present invention, an oxide superconducting thin film that has favorable Jc characteristics even with an average thickness of an intermediate layer of 20 nm or less, and a superconducting fault current limiter that includes the oxide superconducting thin film, can be provided.

EMBODIMENTS FOR CARRYING OUT INVENTION

Figure 1:
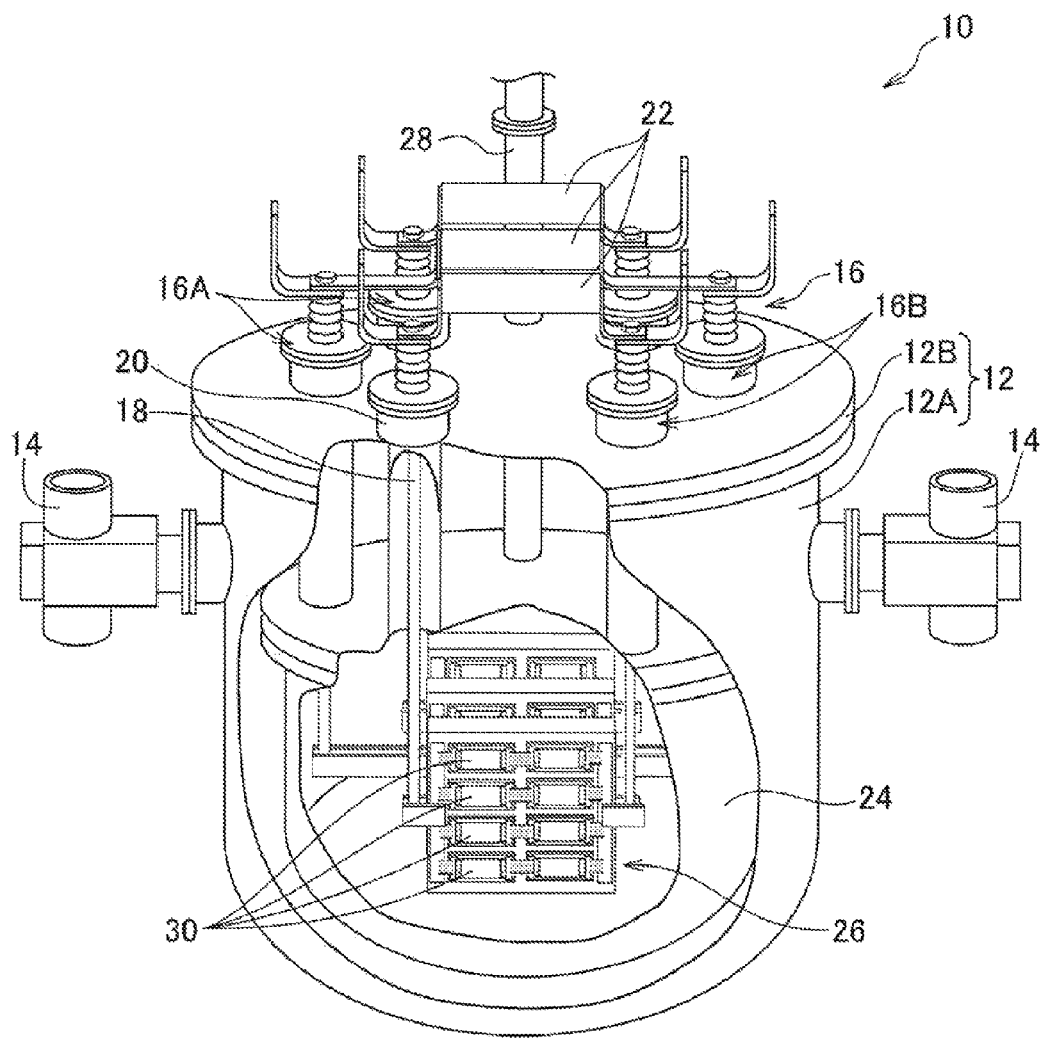
FIG. 1 is a schematic configuration diagram of a superconducting fault current limiter according to an embodiment of the present invention.

Hereinafter, an oxide superconducting thin film and a superconducting fault current limiter according to embodiments of the present invention will be specifically described with reference to the attached drawings. In the drawings, members (components) having the same or corresponding functions are designated by the same reference character, and explanation thereof will be omitted, as appropriate.

<Superconducting Fault Current Limiter>

FIG. 1 is a schematic configuration diagram of a superconducting fault current limiter 10 according to an embodiment of the present invention.

The superconducting fault current limiter 10 according to an embodiment of the present invention is a device having a function of suppressing an overcurrent by utilizing S/N transitions (superconducting-normal state transitions) of a superconductor; the device has a resistance of 0 in a normal state but becomes to have a high resistance when an overcurrent higher than a critical current flows.

The superconducting fault current limiter 10 includes a sealed container 12 in which a container body 12A is sealed by being covered with a lid 12B.

To the container body 12A, a refrigerator 14 is connected, and liquid nitrogen is introduced from the refrigerator 14 into the interior of the sealed container 12. To the lid 12B, an electric current in/out unit 16, through which an electric current flows from outside the sealed container 12 to inside the sealed container 12 or from inside the sealed container 12 to outside the sealed container 12, is connected. The electric current in/out unit 16 is configured with a three-phase alternating current circuit, and, specifically, configured to include three electric current inflow ports 16A and three electric current outflow ports 16B corresponding to the three electric current inflow ports 16A.

Each of the electric current inflow ports 16A and the electric current outflow ports 16B is composed of a conducting wire 18 that penetrates through the lid 12B and extends in a direction perpendicular to the lid 12B, and a cylindrical body 20 that covers the conducting wire 18.

One end of the conducting wire 18 of each electric current inflow port 16A that is exposed to the outside is connected to one end of the conducting wire 18 of its corresponding electric current outflow port 16B that is exposed to the outside, via an external resistance 22 as a shunt resistance.

At an end portion of each cylindrical body 20 located inside the container body 12A, an element housing container 24 is supported.

The element housing container 24 is housed in the sealed container 12, and the element housing container 24, including the inside thereof, is cooled by liquid nitrogen filled into the sealed container 12.

A fault current limiting unit 26 composed of plural thin-film superconducting elements 30 is housed in the element housing container 24. In an embodiment of the present invention, specifically, the fault current limiting unit 26 is composed of three sets of thin-film superconducting elements 30, each set being composed of thin-film superconducting elements 30 arranged in four rows and two columns.

The fault current limiting unit 26 is supported by the other ends of the conducting wires 18 of the electric current inflow ports 16A that are located inside, the other ends of the conducting wires 18 of the electric current outflow ports 16B that are located inside, and a support pillar 28. The other ends of the conducting wires 18 of the electric current inflow ports 16A that are located inside and the other ends of the conducting wire 18 of the electric current outflow ports 16B that are located inside are electrically connected via the thin-film superconducting elements 30, to form a three-phase alternating current circuit.

<Thin-Film Superconducting Element>

Next, an outline of the thin-film superconducting element 30 will be described.

Figure 2:
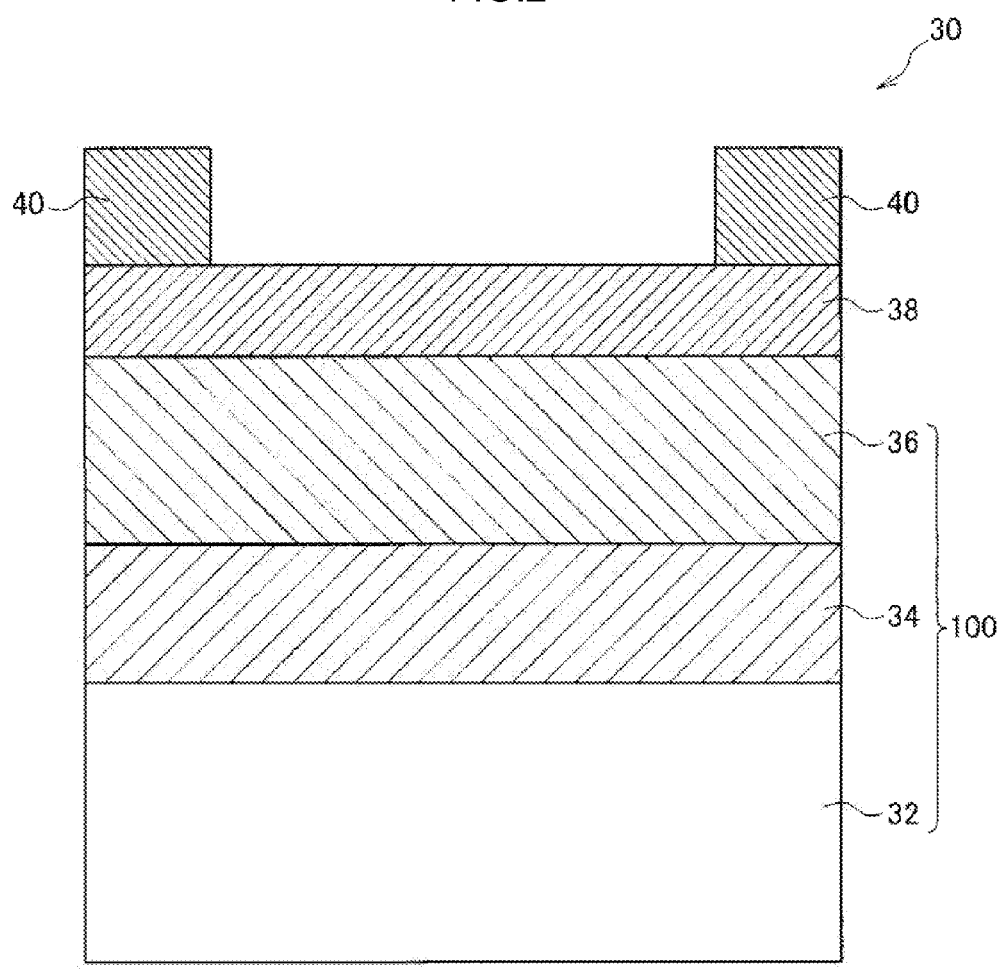
FIG. 2 is a cross-sectional diagram showing a cross-sectional structure of a thin-film superconducting element according to an embodiment of the present invention.

FIG. 2 is a diagram illustrating a cross-sectional structure of the thin-film superconducting element 30 according to an embodiment of the present invention.

As shown in FIG. 2, the thin-film superconducting element 30 has a multilayer structure in which an intermediate layer 34, a superconducting layer 36, and a protective layer 38 are formed in this order on a substrate 32. On the protective layer 38, a pair of electrodes 40 which are electrically connected to the conducting wire 18 are arranged. The substrate 32, the intermediate layer 34, and the superconducting layer 36 in FIG. 2 compose an oxide superconducting thin film 100 according to an embodiment of the present invention.

Next, details of the configuration of the oxide superconducting thin film 100 according to an embodiment of the present invention will be described.

(Intermediate Layer)

First, the intermediate layer 34 will be described.

The intermediate layer 34 is a layer that is formed on the substrate 32 in order to realize high in-plane orientation of the superconducting layer 36.

Average Thickness

In the embodiment of the present invention, the average thickness of the intermediate layer 34 is from 10 nm to 20 nm, and preferably from 10 nm to 15 nm from the viewpoint of further improving Jc characteristics.

The average thickness of the intermediate layer 34 is measured by the following methods. Specifically, the intermediate layer 34 is formed by a method such as vapor-deposition in a state in which a part of the surface of the substrate 32 is covered with a mask, and then the mask is removed, and a step difference between the portion covered with the mask and the portion not covered with the mask is measured using a step profiler, to obtain the thickness of the layer. Since the thickness of the intermediate layer 34 is extremely small, the thickness may be calculated by estimation on a pro-rata basis from the thickness of an intermediate layer formed by performing vapor-deposition for a period of time that is several times longer than a normal vapor-deposition time.

The average thickness is calculated as an average value of the thickness values at arbitrary-selected 10 points measured according to the method described above.

In conventional technologies, there were cases in which, with an average thickness of the intermediate layer as thin as 20 nm or less, the intermediate layer shaped into a large number of small agglomerates having island-like appearance when a superconducting layer was formed on the surface of the intermediate layer formed on a substrate. The shaping of the intermediate layer into islands caused formation of holes in the intermediate layer, which reached the substrate, and caused the superconducting layer and the substrate to react with each other through the holes, as a result of which the Jc characteristics of the oxide superconducting thin film were greatly decreased.

Surface Roughness Ra

In an embodiment of the present invention, the average thickness of the intermediate layer 34 is from 10 nm to 20 nm as described above, and a surface of the intermediate layer 34 at the opposite side from the substrate 32, i.e., a surface that contacts the superconducting layer 36, has a surface roughness Ra of 0.5 nm or less. The surface roughness Ra is more preferably 0.3 nm or less, and particularly preferably 0.2 nm or less. The lower limit of the surface roughness Ra of the surface of intermediate layer 34 that contacts the superconducting layer 36 is preferably 0.03 nm or more, and more preferably 0.05 nm or more.

A surface roughness Ra of the intermediate layer 34 within the range described above suppresses the generation of islands during the formation of the superconducting layer 32 on the surface of the intermediate layer 34, and suppresses the formation of holes in the intermediate layer 34, as a result of which favorable Jc characteristics of the oxide superconducting thin film can be obtained. A surface roughness Ra outside the range described above causes a decrease in the Jc characteristics of the oxide superconducting thin film.

Although the mechanism thereof is not clearly understood, we suppose that the mechanism is as follows. Specifically, we suppose that, since the surface of the intermediate layer 34 is extremely flattened so as to have a roughness Ra of 0.5 nm or less, an area of contact between the surface and the superconducting layer 36 formed on the surface is decreased, and a reaction between a material constituting the intermediate layer 34 and a material constituting the superconducting layer 36 (for example, when $CeO_2$ is used as the intermediate layer 34 and YBCO is used as the superconducting layer 36, generation of $BaCeO_3$, which is a reactant of Ce and Ba) is suppressed, and that the suppression of the reaction causes a crystal structure constituting the intermediate layer 34 and a crystal structure constituting the superconducting layer 36 to tightly adhere to each other, thereby suppressing the formation of islands caused by formation of small agglomerates of the material constituting the intermediate layer 34.

The surface roughness Ra of the intermediate layer 34 is measured using an atomic force microscope (AFM). Here, since the surface roughness Ra of the intermediate layer 34 is extremely small, the measurement using an AFM needs to be performed in environments with sufficiently suppressed mechanical vibration and suppressed electrification. In addition, in order to avoid wearing of a cantilever of the AFM, the cantilever is preferably changed frequently.

Examples of methods for controlling the surface roughness Ra of the intermediate layer 34 to be within the above range include a method including further carrying out heating (post-annealing) after the intermediate layer 34 is formed on the substrate 32. The heating (post-annealing) will be described in detail below.

Composition

The material (composition) constituting the intermediate layer 34 is not particularly limited. Examples thereof include $CeO_2$, and MgO having an NaCl-type crystal structure.

Valence

When the intermediate layer 34 includes $CeO_2$, the average value of the valence of the Ce element as weighed by abundance is preferably from 3.7 to 3.95. When the intermediate layer 34 includes MgO having an NaCl-type crystal structure, the average value of the valence of the Mg element as weighed by abundance is preferably from 1.85 to 1.95.

We suppose that a valence (average value of the valence as weighed by abundance) of the element equal to or lower than the upper limit mentioned above prevents the cohesion of the material constituting the intermediate layer 34 from becoming excessively large; as a result, the generation of islands caused by the formation of small agglomerates of the material constituting the intermediate layer 34 is more effectively suppressed. A valence of the element equal to or higher than the lower limit prevents the reactivity between the material constituting the intermediate layer 34 and the material constituting the superconducting layer 36 from becoming excessively large, and allows the crystal structure constituting the intermediate layer 34 and the crystal structure constituting the superconducting layer 36 to tightly adhere to each other. Thus, the island formation caused by the formation of small agglomerates of the material constituting the intermediate layer 34 is more effectively prevented.

The valence (average value of the valence as weighed by abundance) of the element is measured using an X-ray photoelectron spectroscopy (XPS). A peak position in an XPS spectrum varies depending on the valence due to a chemical shift, and the number of atoms of each valence is proportional to the area of the corresponding spectrum. Accordingly, a ratio between the numbers of atoms having respective valences is obtained from the shape of the spectrum, and an average value of the valence as weighed by abundance is calculated from the ratio between the numbers.

For example, trivalent and tetravalent cerium atoms are present as cerium atoms in $CeO_2$, and the ratio between the number of trivalent cerium atoms and the number of tetravalent cerium atoms can be obtained from the shape of the XPS spectrum. The valence is calculated using the obtained ratio between the numbers.

Examples of methods for adjusting the valence (average value of the valence as weighed by abundance) of the material constituting the intermediate layer 34 to be within the above-mentioned range include a method including further carrying out heating (post-annealing) after the intermediate layer 34 is formed on the substrate 32. The heating (post-annealing) will be described in detail below.

The intermediate layer 34 preferably has an orientation with a lattice match of a copper oxide superconductor such as YBCO. In particular, when the superconductor is formed of YBCO and the intermediate layer is formed of $CeO_2$, the orientation of $CeO_2$ is preferably a (001) orientation.

(Substrate)

The substrate 32 has a single crystal structure of a metal oxide or a ceramic. The shape of the substrate 32 may be any of various shapes that have a main face. However, it is preferable to employ a rectangular flat plate shape due to its easiness in handling.

The thickness of the substrate 32 is not particularly limited. The thickness of the substrate 32 may be, for example, 1 mm.

Composition

Specific examples of the metal oxide include $Al_2O_3$ (aluminum oxide, particularly sapphire), $(Zr,Y)O_2$ (yttria-stabilized zirconia), $LaAlO_3$ (lanthanum aluminate), $SrTiO_3$ (strontium titanate), $(La_xSr_{1-x})(Al_xTa_{1-x})O_3$ (lanthanum-strontium-tantalum-aluminum oxide), $NdGaO_3$ (neodymium gallate), $YAlO_3$ (yttrium aluminate), $MgO$ (magnesium oxide), $TiO_2$ (titania), and $BaTiO_3$ (barium titanate). Specific examples of the ceramic include silicon carbide and graphite.

Among them, in particular, it is preferable to employ a sapphire substrate from the viewpoint of obtaining high strength and high thermal conductivity in the case of application to superconducting fault current limiters.

Dislocation

Figure 5:
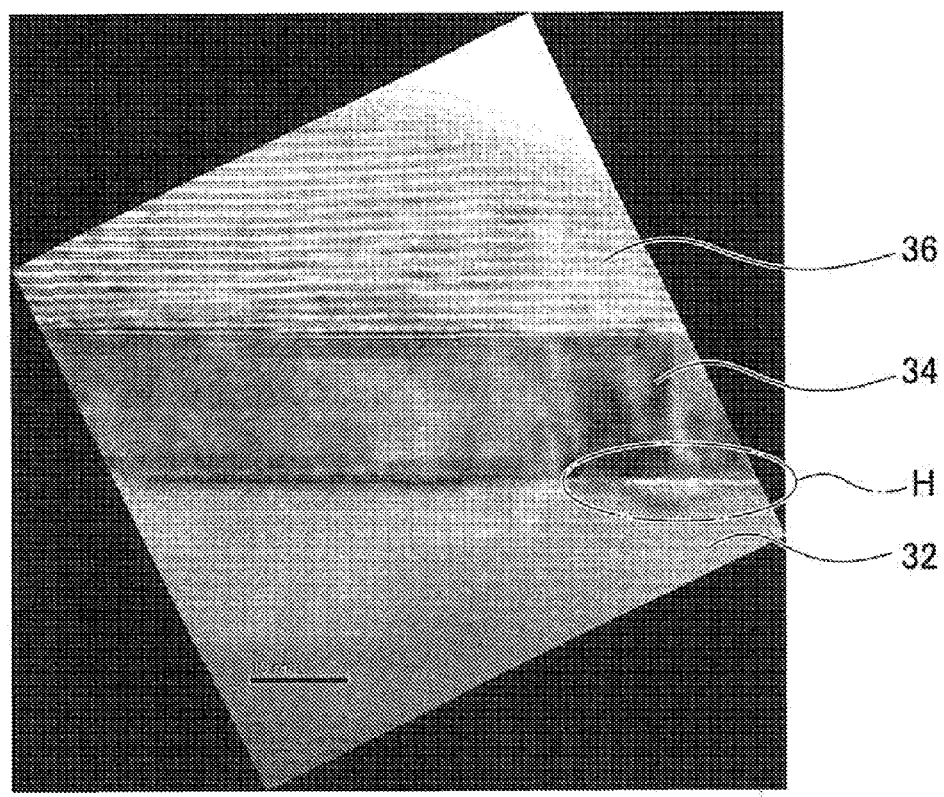
FIG. 5 is a cross-sectional image of a superconducting thin film in which dislocation occurs in a portion of a substrate located at an interface between the substrate and an intermediate layer.

When the intermediate layer 34 is provided on the surface of the substrate 32, the substrate 32 preferably includes, at the interface between the substrate 32 and the intermediate layer 34, a portion in which dislocation (dislocation of a crystal structure or lattice distortion such as those indicated by "H" in FIG. 5) occurs.

Here, as an example, a case in which the substrate 32 is formed of sapphire, and in which the intermediate layer 34 is formed of $CeO_2$, and in which the superconducting layer 36 is formed of YBCO will be discussed. The lattice constant of YBCO (an average value of the lattice constant in the a-axis and the lattice constant in the b-axis) is 3.85 angstroms, and the distance between Ce atoms in $CeO_2$ is 3.83 angstroms. Therefore, the lattice mismatch between $CeO_2$ and YBCO is as small as about 0.5%. However, the lattice constant of the sapphire is 3.49 angstroms. Therefore, the lattice mismatch between the $CeO_2$ and the sapphire is 10%. Assuming that there is no dislocation in the substrate 32, the lattice of the $CeO_2$ of the intermediate layer 34 is deformed in order to match the lattice of the sapphire, and the deformation is remarkable particularly when the intermediate layer 34 is a thin film. As a result, the lattice constant of the $CeO_2$ is decreased, and the lattice mismatch between the YBCO and the $CeO_2$ increases, thereby weakening the adhesion between the intermediate layer 34 and the superconducting layer 36. This results in higher tendency for the intermediate layer 34 to shape into an island-shape.

In contrast, occurrence of dislocation of the crystal structure (dislocation of the crystal structure or lattice distortion) in the substrate 32 decreases the lattice distortion occurring during the formation of the intermediate layer 34 as compared to a case in which dislocation does not occur in the substrate 32, and, therefore, decreases the lattice mismatch between the YBCO and the $CeO_2$. As a result, it is thought that the crystal of the superconducting layer 36 formed on the intermediate layer 34 does not have lattice distortion, and that the crystal structure constituting the intermediate layer 34 and the crystal structure constituting the superconducting layer 36 tightly adhere to each other. It is presumed that the tight adhesion more effectively suppresses the island formation caused by the formation of small agglomerates of the material constituting the intermediate layer 34.

Whether or not the dislocation (lattice distortion) of the crystal structure occurs in a portion of the substrate 32 located at the interface between the substrate 32 and the intermediate layer 34 can be confirmed by observation of a cross-section using a transmission electron microscope (TEM).

Examples of methods for generating dislocation (lattice distortion) of the crystal structure in a portion of the substrate 32 located at the interface between the substrate 32 and the intermediate layer 34 include a method including carrying out heating (pre-annealing) before the intermediate layer 34 is formed on the substrate 32. The heating (pre-annealing) will be described in detail below.

(Superconducting Layer)

The superconducting layer 36 is formed on the surface of the intermediate layer 34, and includes an oxide superconductor as a main component. The term "main component" means a component having the highest content among the components contained in the superconducting layer 36, and the content thereof is preferably 50% or more.

The superconducting layer 36 is preferably formed of an oxide superconductor, and more preferably formed of a copper oxide superconductor.

A crystal material represented by a composition formula of, for example, $REBa_2Cu_3O_{7-\delta}$ (referred to as RE-123), $Bi_2Sr_2CaCu_2O_{8+\delta}$ (including those obtained by doping Pb or the like to Bi sites), $Bi_2Sr_2Ca_2Cu_3O_{10+\delta}$ (including those obtained by doping Pb or the like to Bi sites), $(La, Ba)_2CuO_{4-\delta}$, $(Ca, Sr)CuO_{2-\delta}$ [in which Ca sites may be replaced by Ba], $(Nd, Ce)_2CuO_{4-\delta}$, $(Cu, Mo)Sr_2(Ce, Y)_sCu_{2-\delta}$ [referred to as (Cu, Mo)-12s2, s representing 1, 2, 3, or 4], $Ba(Pb, Bi)O_3$, or $Tl_2Ba_2Ca_{n-1}Cu_nO_{2n+4}$ (in which n represents an integer of 2 or greater) may be used as the copper oxide superconductor. The copper oxide superconductor may also be formed of any combination of these crystal materials.

RE in $REBa_2Cu_3O_{7-\delta}$ represents a single rare earth element such as Y, Nd, Sm, Eu, Gd, Dy, Ho, Er, Tm, Yb, or Lu, or plural rare earth elements; among these, RE is preferably Y for reasons such as difficulty in substitution between Y sites and Ba sites and provision of high superconducting transition temperature. In addition, $\delta$ represents an oxygen non-stoichiometric amount, and $\delta$ is, for example, from 0 to 1. A value of $\delta$ nearer to 0 is more preferable since a value of $\delta$ nearer to 0 provides a higher superconducting transition temperature. In a case in which high pressure oxygen annealing or the like is performed using an apparatus such as an autoclave, the oxygen non-stoichiometric amount is may be less than 0, i.e., a negative value.

Further, $\delta$ of a crystal material other than $REBa_2Cu_3O_{7-\delta}$ also represents an oxygen non-stoichiometric amount, which is, for example, from 0 to 1.

The thickness of the oxide superconducting layer 36 is not particularly limited. The thickness of the oxide superconducting layer 36 is, for example, 200 nm.

The superconducting layer 36 preferably has a crystal structure in a c-axis orientation, from the viewpoint of enabling efficient flow of electricity. Here, the scope of the "c-axis orientation" also includes orientations having an angle error within about ±5 degrees.

(Protective Layer and Electrode)

A protective layer and electrodes shown in FIG. 2 will be described.

A protective layer 38 is formed of silver or the like. The thickness of the protective layer 38 is not particularly limited. The thickness of the protective layer 38 is, for example, 200 nm. A pair of electrodes 40 is formed of a conductive member such as a gold-silver alloy.

<Method of Manufacturing Oxide Superconducting Thin Film>

Next, a method of manufacturing the oxide superconducting thin film 100 will specifically be described.

FIGS. 3A to 3E are diagrams illustrating processes in the method of manufacturing an oxide superconducting thin film 100 according to an embodiment of the present invention.

—Pre-Annealing Process—

Figure 3A:
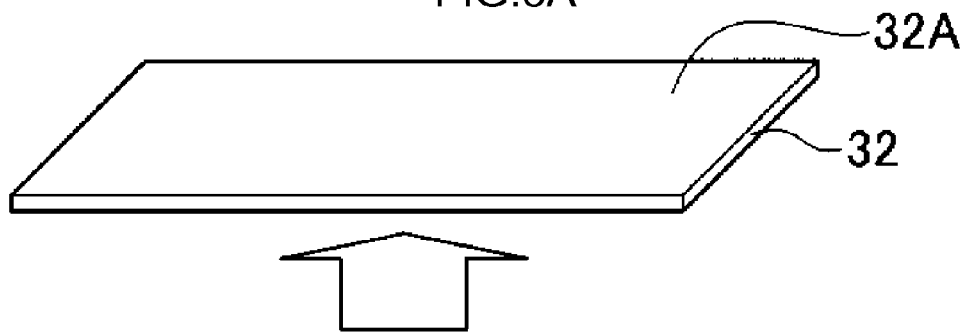
FIG. 3A is a diagram showing a process in a method of manufacturing an oxide superconducting thin film according to an embodiment of the present invention.

In the method of manufacturing an oxide superconducting thin film 100 according to ab embodiment of the present invention, first, a pre-annealing process is performed, as shown in FIG. 3A. In the pre-annealing process, a ground substrate 32 is subjected to pre-annealing in a temperature range of, for example, from 800° C. to 1,200° C. The heating in the pre-annealing process may be carried out by, for example, heating the substrate 32 in the atmospheric air using a muffle furnace.

In the pre-annealing process, dislocation of crystals occurs at an interface on the substrate 32 (an interface on a side on which an intermediate layer is to be formed in the aftermentioned intermediate layer forming process). From the viewpoint of more reliably causing the dislocation of crystals, the temperature of the pre-annealing process is preferably from 900° C. to 1,100° C., and the pre-annealing time is preferably from 60 minutes to 120 minutes.

—Intermediate Layer Forming Process—

Figure 3B:
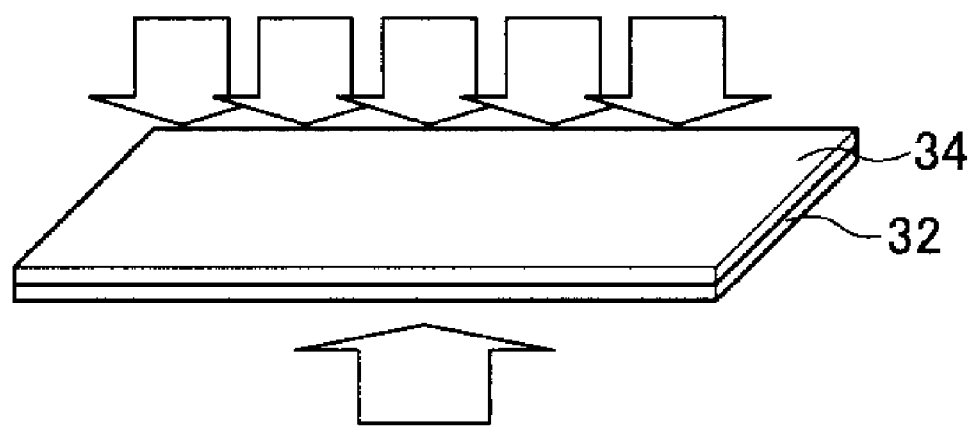
FIG. 3B is a diagram showing a process in a method of manufacturing an oxide superconducting thin film according to an embodiment of the present invention.

Next, an intermediate layer forming process is performed, as shown in FIG. 3B. Examples of methods for forming the intermediate layer 34 that may be employed include a pulse laser deposition (PLD) method, a chemical vapor deposition (CVD) method, a metal organic chemical vapor deposition (MOCVD) method, an ion beam assisted deposition (IBAD) method, a tri fluoro acetate-metal organic deposition (TFA-MOD) method, a sputtering method and an electron beam deposition method. Among them, an IBAD method is preferably used, considering that this method realizes a high degree of orientation. An electron beam deposition method is preferably used, considering that this method realizes highly efficient film formation.

In a case in which an electron beam deposition method, for example, is employed in the intermediate layer forming process, deposition is carried out in a state in which a plasma is generated in oxygen at a pressure of $1 \times 10^{-4}$ Pa to $1 \times 10^{-1}$ Pa and in which the substrate 32 is heated to 700° C. or higher, so as to vapor-deposit a film formed of $CeO_2$ or the like to a thickness of 10 nm to 20 nm on the substrate 32, thereby forming the intermediate layer 34.

—Post-Annealing Process—

Figure 3C:
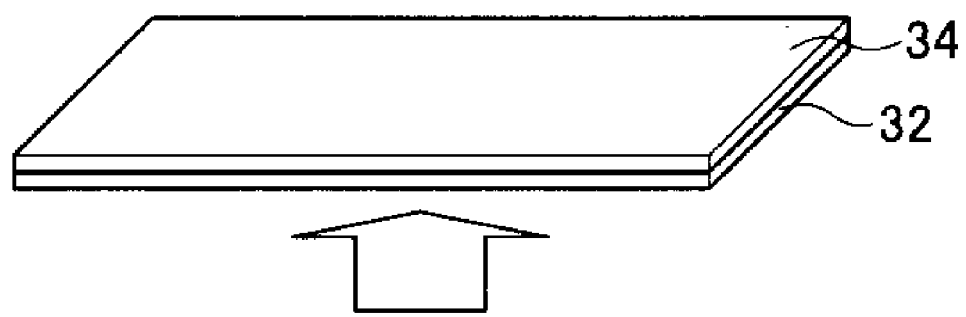
FIG. 3C is a diagram showing a process in a method of manufacturing an oxide superconducting thin film according to an embodiment of the present invention.

Next, a post-annealing process is performed, as shown in FIG. 3C. In the post-annealing process, the substrate 32 is heated at a temperature in a temperature range of, for example, from 700° C. to 1,000° C., thereby surface-treating the intermediate layer 34. The heating in the post-annealing process may be carried out by, for example, heating the intermediate layer 34 in the atmospheric air or in an oxygen atmosphere using a muffle furnace.

Through the post-annealing process, the intermediate layer 34 is flattened such that the surface roughness Ra of a surface of the intermediate layer 34 at an opposite from the substrate 32 is adjusted to be within the aforementioned range. In addition, the valence of the compound constituting the intermediate layer 34 (for example, when the compound is the $CeO_2$, the average value of the valence of the Ce element as weighed by abundance; or, when the compound is the MgO having an NaCl-type crystal structure, the average value of the valence of the Mg element as weighed by abundance) is adjusted to be within the aforementioned range. From the viewpoint of more reliably adjusting the surface roughness Ra of the intermediate layer 34 and the valence of the compound constituting the intermediate layer 34 to be within the aforementioned ranges, the temperature in the post-annealing process is preferably from 800° C. to 900° C., and the post-annealing time is preferably from 60 minutes to 120 minutes.

—Superconducting Layer Forming Process—

Figure 3D:
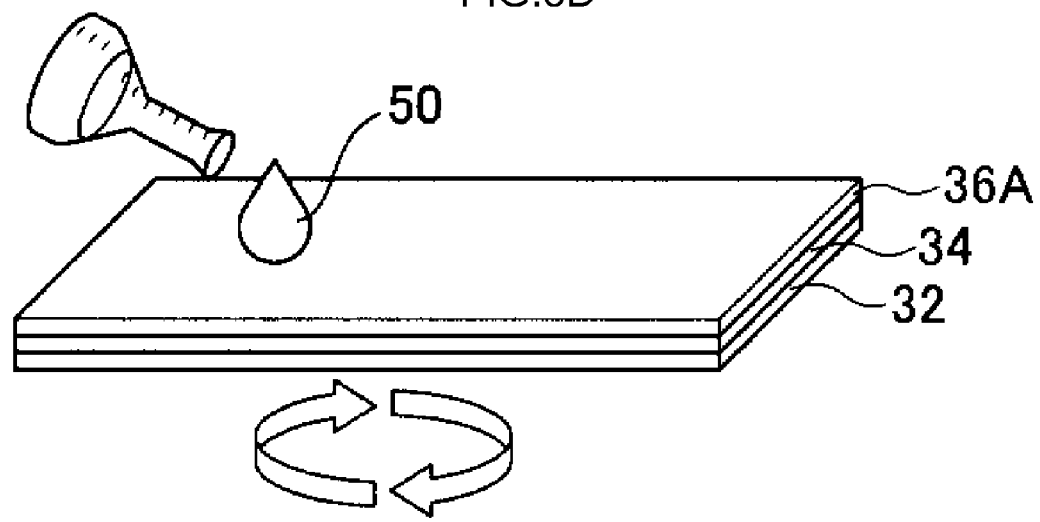
FIG. 3D is a diagram showing a process in a method of manufacturing an oxide superconducting thin film according to an embodiment of the present invention.
Figure 3E:
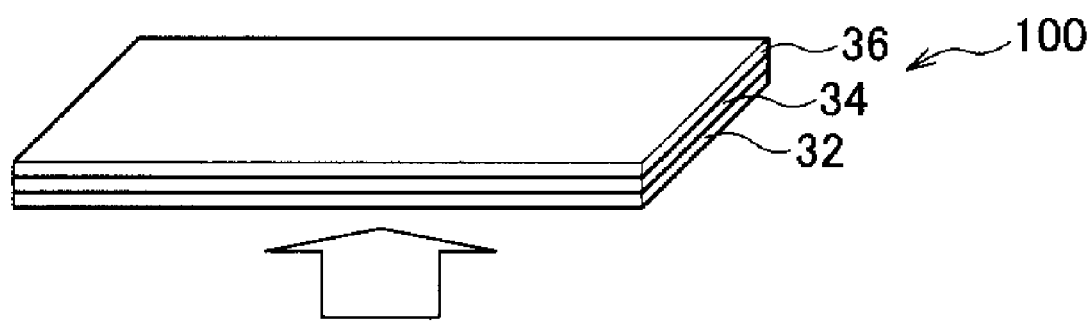
FIG. 3E is a diagram showing a process in a method of manufacturing an oxide superconducting thin film according to an embodiment of the present invention.
Figure 4A:
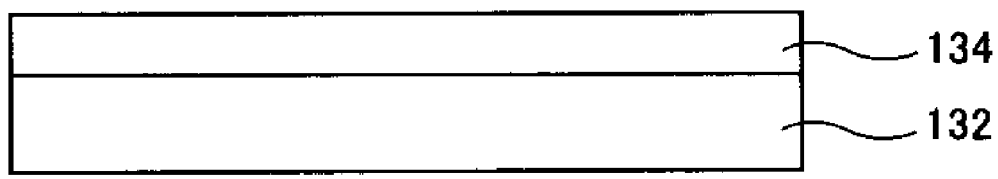
FIG. 4A is a schematic cross-sectional diagram for explaining a state in which an intermediate layer shapes into an island-like shape in a conventional oxide superconducting thin film.
Figure 4B:
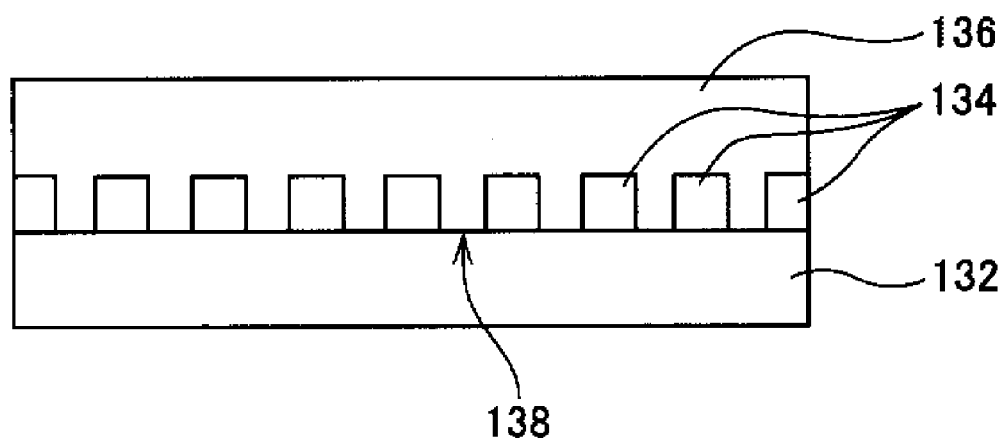
FIG. 4B is a schematic cross-sectional diagram for explaining a state in which an intermediate layer shapes into an island-like shape in a conventional oxide superconducting thin film.

Next, a superconducting layer forming process is performed, as shown in FIGS. 3D and 3E. Examples of methods for forming (film-forming) the superconducting layer 36 include a pulse laser deposition (PLD) method, a chemical vapor deposition (CVD) method, a metal organic chemical vapor deposition (MOCVD) method, a metal organic deposition (MOD) method, and a sputtering method. Among these film-forming methods, a MOCVD method is preferably used since this method does not require high vacuum, enables film formation even on a large-sized substrate 32 having a complicated shape, and has high suitability for mass production. In addition, a MOD method is preferably used, considering that this method realizes highly efficient film formation.

In a case in which, for example, a superconducting layer 36 formed of YBCO is to be formed using an MOD method in the superconducting layer forming process, first, a solution 50 of organic complexes of yttrium, barium and copper is applied to the surface of the intermediate layer 34 using a spin coater, to form a precursor film 36A, as shown in FIG. 3D. Then, as shown in FIG. 3E, the precursor film 36A is subjected to preliminary calcination, for example, at a temperature of from 300° C. to 600° C. in the air.

After organic solvent is removed by the preliminary calcination, the film 36A is subjected to main calcination at a temperature of from 700° C. to 900° C., whereby a superconducting layer 36 formed of an oxide superconductor of YBCO is obtained from the film 36A.

Here, the main calcination may be performed in an inert atmosphere at the beginning, and the atmosphere for the main calcination may be changed to an oxygen atmosphere at some point of time during the main calcination. As a result of this, a superconducting layer 36 highly annealed with oxygen and having favorable Jc characteristics can be obtained.

Modified Embodiments

Although specific embodiments of the present invention are described above in detail, the present invention is not limited to those embodiments. It will be obvious to those skilled in the art that other various embodiments can be practiced within the scope of the invention. For example, two or more of the embodiments described above may be combined, as appropriate, to implement the present invention. In addition, the following modified embodiments may be combined, as appropriate.

For example, the intermediate layer 34 may be formed on the substrate 32 with one or more other layers interposed between the intermediate layer 34 and the substrate 32.

The protective layer 38 may be omitted, as appropriate.

Although a case in which the oxide superconducting thin film 100 is used as the thin-film superconducting element 30 of the superconducting fault current limiter 10 has been described in the present embodiment, the oxide superconducting thin film 100 can be applied to various other apparatuses, such as a superconducting wire rod obtained using a substrate having a large length as the substrate 32. The oxide superconducting thin film 100 can be widely applied to apparatuses such as a superconducting magnetic energy storage (SMES), a superconducting transformer, a nuclear magnetic resonance (NMR) analyzer, a single crystal pulling apparatus, a linear motor car and a magnetic separation apparatus.

The disclosure of Japanese Patent Application No. 2011-122220 is incorporated by reference herein in its entirety.

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, the oxide superconducting thin film and the superconducting fault current limiter according to the present invention will be described with reference to examples. However, the present invention is by no means limited by these examples.

In Examples, thin-film superconducting elements for use in the superconducting fault current limiter were manufactured as the oxide superconducting thin films.

Example 1

Preparation of Sapphire Substrate

A commercially available sapphire substrate having a ground R-plane (a sapphire substrate of which one surface has been ground, manufactured by KYOCERA Corporation; size: 210 mm×30 mm×1 mm) was subjected to pre-annealing at 1,000° C. in the air (heating apparatus: high performance muffle furnace HPM-2N manufactured by AS ONE Corporation), to obtain a sapphire substrate having a flat surface.

Formation of Intermediate Layer

Next, while the substrate was heated at 800° C., a thin film of cerium oxide ($CeO_2$) was vapor-deposited to a thickness of 15 nm using electron beam (EB) deposition. During the film formation, a small amount of oxygen was introduced to set the oxygen partial pressure to $5 \times 10^{-2}$ Pa, and an oxygen plasma was generated using RF. After the vapor-deposition, the substrate was subjected to post-annealing at 800° C. in the air for 1.5 hours (heating apparatus: high performance muffle furnace HPM-2N manufactured by AS ONE Corporation), whereby an intermediate layer was formed.

The obtained intermediate layer (cerium oxide thin film) was examined using X-ray diffraction and an X-ray pole figure, as a result of which the cerium oxide was found to be oriented in a (001) orientation, and other orientation components were not observed.

The morphology of the obtained intermediate layer (cerium oxide thin film) was observed using AFM, and the surface was found to be very smooth and holes that reached the sapphire substrate were not observed. Further, the surface roughness Ra was measured using AFM, as and the surface roughness was found to be 0.15 nm.

Further, the valence of cerium in the obtained intermediate layer (cerium oxide thin film) was examined using XPS, and the valence (average value of the valence as weighed by abundance) was 3.9. In the XPS, signals of Al were not detected. This result confirms that the entire surface of the sapphire substrate was covered with cerium oxide.

Formation of Superconducting Layer

A solution of organic complexes of yttrium, barium and copper was applied to the surface of the intermediate layer (cerium oxide thin film) using a spin coater, and preliminary calcination was performed at 500° C. in the air. Then, main calcination was performed at 800° C. in an inert atmosphere, and the atmosphere was changed to an oxygen atmosphere at some point of time during the main calcination. As a result, a superconducting layer formed of YBCO was finally formed. In this way, an oxide superconducting thin film was obtained. The thickness of the superconducting layer (YBCO layer) was 150 nm.

The obtained superconducting layer (YBCO layer) was examined using X-ray diffraction and an X-ray pole figure, as a result of which the entirety of the YBCO was found to be oriented in the c-axis direction, and other orientation components were not observed. In addition, signals from $BaCeO_3$, which is a reaction product of YBCO in the superconducting layer and $CeO_2$ in the intermediate layer or signals from $BaAl_2O_4$, which is a reaction product of YBCO and the substrate (sapphire), were not detected.

Subsequently, the cross-section of the obtained substrate was observed using a TEM. Even in this state, it was observed that a surface of the sapphire substrate was entirely covered with the intermediate layer (cerium oxide thin film). Reaction products such as $BaCeO_3$ and $BaAl_2O_4$ were not observed. It was observed that dislocation occurred at the sapphire substrate side of the interface between the intermediate layer (cerium oxide thin film) and the sapphire substrate.

Jc Characteristics

The critical current density (Jc) distribution of the oxide superconducting thin film at the liquid nitrogen temperature was measured by an induction method using CRYOSCAN manufactured by THEVA, and an even distribution of from 2.8 MA/cm² to 3.2 MA/cm² in the plane was obtained.

Formation of Protective Film and Electrodes

A gold-silver alloy protective film was formed on the obtained oxide superconducting thin film using a sputtering method, and electrodes were attached thereto, whereby a thin-film superconducting element was prepared. Here, a gold-silver alloy having a composition of Ag-23 at % Au was used as the gold-silver alloy. The critical current (Ic) of the element was measured by an electric current test, and the Ic value was found to be 120 A.

Although the obtained thin-film superconducting element is made to get into a superconducting state by being cooled to the liquid nitrogen temperature, the element gets into a normal conducting state when an electric current in a certain quantity or more flows therein, whereby the element is able to limit a fault current.

Example 2

An oxide superconducting thin film and a thin-film superconducting element were prepared in the same manner as in Example 1, except that the post-annealing was performed in an oxygen atmosphere rather than in the air.

First, the obtained intermediate layer (cerium oxide thin film) was examined using X-ray diffraction and an X-ray pole figure, as a result of which the cerium oxide was found to be oriented in a (001) orientation, and other orientation components were not observed.

In addition, the morphology of the obtained intermediate layer (cerium oxide thin film) was observed using AFM, and the surface was found to be very smooth, and holes that reached the sapphire substrate were not observed. The surface roughness was 0.15 nm.

Further, the valence of cerium in the obtained intermediate layer (cerium oxide thin film) was examined using XPS, and the valence (average value of the valence as weighed by abundance) was 3.9. In the XPS, signals of Al were not detected. This confirms that the surface of the sapphire substrate was entirely covered with cerium oxide.

The obtained superconducting layer (YBCO layer) was examined using X-ray diffraction and an X-ray pole figure, and the entirety of the YBCO was found to be oriented in the c-axis direction, and other orientation components were not observed. Signals from $BaCeO_3$, which is a reaction product of YBCO in the superconducting layer and $CeO_2$ in the intermediate layer, or $BaAl_2O_4$, which is a reaction product of YBCO and the substrate (sapphire), were not detected, either.

Subsequently, the cross-section of the obtained substrate was observed using a TEM. Even in this state, it was observed that a surface of the sapphire substrate was covered with the intermediate layer (cerium oxide thin film). Reaction products such as $BaCeO_3$ and $BaAl_2O_4$ were not observed. It was observed that dislocation occurred at the sapphire substrate side of the interface between the intermediate layer (cerium oxide thin film) and the sapphire substrate.

Jc Characteristics

The critical current density (Jc) distribution of the oxide superconducting thin film at the liquid nitrogen temperature was measured by an induction method using CRYOSCAN manufactured by THEVA, and an even distribution of from 2.8 MA/cm² to 3.4 MA/cm² in the plane was obtained.

The critical current (Ic) of the obtained thin-film superconducting element was measured by an electric current test, and the Ic value was found to be 120 A.

Although the obtained thin-film superconducting element is made to get into a superconducting state by being cooled to the liquid nitrogen temperature, the element gets into a normal conducting state when an electric current in a certain quantity or more flows therein, whereby the element is able to limit fault current.

Examples 3 and 4

Oxide superconducting thin films were prepared in the same manner as in Example 1, except that the thickness of the intermediate layer (cerium oxide thin films) was changed to 10 nm (Example 3) and 20 nm (Example 4).

First, each of the obtained intermediate layers (cerium oxide thin films) was examined using X-ray diffraction and an X-ray pole figure, as a result of which the cerium oxide was found to be oriented in a (001) orientation, and other orientation components were not observed.

In addition, the morphology of each of the obtained intermediate layers (cerium oxide thin films) was observed using AFM, and the surface was found to be very smooth, and holes that reached the sapphire substrate were not observed. The surface roughness was 0.15 nm.

Further, the valence of cerium in each of the obtained intermediate layers (cerium oxide thin films) was examined using XPS, and the valence (average value of the valence as weighed by abundance) was 3.9. In the XPS, signals of Al were not detected. This confirms that the surface of the sapphire substrate was entirely covered with cerium oxide.

The critical current density (Jc) distribution of each of the oxide superconducting thin films at the liquid nitrogen temperature was measured by an induction method using CRYOSCAN manufactured by THEVA, and an even distribution of from 2.8 MA/cm² to 3.4 MA/cm² in the plane was obtained.

The critical current (Ic) of each of the obtained thin-film superconducting elements was measured by an electric current test, and the Ic value was found to be 120 A.

Comparative Example 1

An oxide superconducting thin film was prepared in the same manner as in Example 1, except that the post-annealing was performed at 500° C. in the air.

First, the obtained intermediate layer (cerium oxide thin film) was examined using X-ray diffraction and an X-ray pole figure, as a result of which the cerium oxide was found to be oriented in a (001) orientation, and other orientation components were not observed.

In addition, the morphology of the obtained intermediate layer (cerium oxide thin film) was observed using AFM, as a result of which crystal grains of cerium oxide were observed, and the surface roughness Ra was 0.6 nm.

Further, the valence of cerium in the obtained intermediate layer (cerium oxide thin film) was examined using XPS, and the valence (average value of the valence as weighed by abundance) was 3.9.

The obtained superconducting layer (YBCO layer) was examined using X-ray diffraction and an X-ray pole figure. As a result, although the entirety of the YBCO was found to be oriented in the c-axis direction, the diffraction strength was weaker than that in Example 1. In addition, a peak indicating $BaCeO_3$, which is a reaction product of YBCO in the superconducting layer and $CeO_2$ in the intermediate layer, was observed. This demonstrates that the YBCO and the $CeO_2$ reacted with each other.

The critical current density (Jc) of the oxide superconducting thin film at the liquid nitrogen temperature was measured, and the critical current density was found to be 0 all over the surface.

Comparative Examples 2 and 3

Oxide superconducting thin films were prepared in the same manner as in Comparative Example 1, except that the thickness of the intermediate layer (cerium oxide thin film) was changed to 10 nm (Comparative Example 2) and 20 nm (Comparative Example 3).

First, each of the obtained intermediate layers (cerium oxide thin films) was examined using X-ray diffraction and an X-ray pole figure, as a result of which the cerium oxide was found to be oriented in a (001) orientation, and other orientation components were not observed.

In addition, when the morphology of each of the obtained intermediate layers (cerium oxide thin films) was observed using AFM, as a result of which crystal grains of cerium oxide were observed, and the surface roughness Ra was 0.6 nm.

Further, the valence of cerium in each of the obtained intermediate layers (cerium oxide thin films) was examined using XPS, and the valence (average value of the valence as weighed by abundance) was 3.9.

Each of the obtained superconducting layers (YBCO layers) was examined using X-ray diffraction and an X-ray pole figure. As a result, although the entirety of the YBCO was found to be oriented in the c-axis direction, the diffraction strength was weaker than that in Examples 3 and 4. In addition, a peak indicating $BaCeO_3$, which is a reaction product of YBCO in the superconducting layer and $CeO_2$ in the intermediate layer, was observed. This demonstrates that the YBCO and the $CeO_2$ reacted with each other.

The critical current density (Jc) of each of the oxide superconducting thin films at the liquid nitrogen temperature was measured, and the critical current density was found to be 0 all over the surface.

Comparative Example 4

An oxide superconducting thin film was prepared in the same manner as in Example 1, except that the thickness of the intermediate layer (cerium oxide thin film) was changed to 5 nm.

First, the obtained intermediate layer (cerium oxide thin film) was examined using X-ray diffraction and an X-ray pole figure, as a result of which the cerium oxide was found to be oriented in a (001) orientation, and other orientation components were not observed.

In addition, the morphology of the obtained intermediate layer (cerium oxide thin film) was observed using AFM, as a result of which the cerium oxide was found to have an island-shape, the difference in height was about 5 nm, and the sapphire substrate was exposed.

Further, the valence of cerium in the obtained intermediate layer (cerium oxide thin film) was examined using XPS, and the valence (average value of the valence as weighed by abundance) was 3.9.

The obtained superconducting layer (YBCO layer) was examined using X-ray diffraction and an X-ray pole figure. As a result, although the entirety of the YBCO was oriented in the c-axis direction, the diffraction strength was weaker than that in Example 1. In addition, a peak indicating $BaAl_2O_4$, which is a reaction product of YBCO in the superconducting layer and sapphire in the substrate, was observed. This demonstrates that the YBCO and the sapphire reacted with each other.

The critical current density (Jc) of the oxide superconducting thin film at the liquid nitrogen temperature was measured, and the critical current density was found to be 0 all over the surface.

Examples 5 to 21 and Comparative Examples 5 to 7

Superconducting elements were prepared in the same manner as in Examples 1 to 4 and Comparative Examples 1 to 4, except that the material, the average thickness, the surface roughness Ra, and the average valence of the intermediate layer were adjusted as shown in Table 1.

[Evaluation Tests]

The obtained superconducting elements were subjected to the same evaluations as those in Examples 1 to 4 and Comparative Examples 1 to 4.

—Evaluation of Film Formation State—

The following evaluation criteria were set based on the film formation state of the intermediate layer.

A: The surface roughness Ra is 0.5 nm or less, and the surface of the substrate is entirely covered with the intermediate layer.

B: The surface roughness Ra is more than 0.5 nm, but the surface of the substrate is entirely covered with the intermediate layer C: There is a hole in the intermediate layer that reaches the substrate —Evaluation on Reaction Suppression State—

The following evaluation criteria were set based on the reaction suppression state at the intermediate layer.

A: Reaction products are not detected in X-ray diffraction (XRD), reaction products are not detected in TEM observation, and the XRD intensity of the superconducting layer is large such that the intensity of the (006) peak of the YBCO is 10,000 cps or more.

B: Reaction products are not detected in XRD, but at least 1/100 of the surface of the substrate is found to be covered with reaction products in TEM observation.

C: A small amount (equal to or greater than the noise level) of reaction products are detected in XRD, but the intensity of the (006) peak of the YBCO in the XRD of the superconducting layer is 10,000 cps or more.

D: Reaction products are detected in XRD, and the intensity of the (006) peak of the YBCO in the XRD of the superconducting layer is 1,000 cps or less.

—Evaluation on Superconducting Properties—

Further, in order to evaluate the superconducting properties, the critical current density (Jc) distribution of the oxide superconducting thin film at the liquid nitrogen temperature was measured by an induction method using CRYOSCAN manufactured by THEVA, and the following evaluation criteria were set.

A: $Jc > 2.5$ MA/cm$^2$
B: $2.5$ MA/cm$^2 \leq Jc > 1.0$ MA/cm$^2$
C: $1.0$ MA/cm$^2 \leq Jc > 0$ MA/cm$^2$
D: $Jc = 0$ MA/cm$^2$

TABLE 1

| | | Intermediate layer | | | | Evaluation | | |
| --- | --- | --- | --- | --- | --- | --- | --- | --- |
| | | Material | Average thickness (nm) | Surface roughness Ra (nm) | Average Valence | Film formation state | Reaction suppression state | Superconducting properties |
| Examples | 1 | $CeO_2$ | 15 | 0.15 | 3.9 | A | A | A |
| | 2 | $CeO_2$ | 15 | 0.15 | 3.9 | A | A | A |
| | 3 | $CeO_2$ | 10 | 0.15 | 3.9 | A | A | A |
| | 4 | $CeO_2$ | 20 | 0.15 | 3.9 | A | A | A |
| | 5 | $CeO_2$ | 15 | 0.5 | 3.9 | A | C | C |
| | 6 | $CeO_2$ | 15 | 0.4 | 3.9 | A | C | C |

TABLE 1-continued

|  |  | Intermediate layer | | | Evaluation | | |
|---|---|---|---|---|---|---|---|
|  |  | Material | Average thickness (nm) | Surface roughness Ra (nm) | Average Valence | Film formation state | Reaction suppression state | Superconducting properties |
|  | 7 | CeO$_2$ | 15 | 0.3 | 3.9 | A | B | B |
|  | 8 | CeO$_2$ | 15 | 0.2 | 3.9 | A | A | A |
|  | 9 | CeO$_2$ | 15 | 0.15 | 4 | A | B | C |
|  | 10 | CeO$_2$ | 15 | 0.15 | 3.8 | A | A | A |
|  | 11 | CeO$_2$ | 15 | 0.15 | 3.7 | A | B | B |
|  | 12 | CeO$_2$ | 15 | 0.15 | 3.6 | A | C | C |
| Comparative | 1 | CeO$_2$ | 15 | 0.6 | 3.9 | B | D | D |
| Examples | 2 | CeO$_2$ | 10 | 0.6 | 3.9 | B | D | D |
|  | 3 | CeO$_2$ | 20 | 0.6 | 3.9 | B | D | D |
|  | 4 | CeO$_2$ | 5 | 0.15 | 3.9 | C | D | D |
|  | 5 | CeO$_2$ | 15 | 0.7 | 3.9 | B | D | D |
| Examples | 13 | MgO | 15 | 0.15 | 1.9 | A | A | A |
|  | 14 | MgO | 10 | 0.15 | 1.9 | A | A | A |
|  | 15 | MgO | 20 | 0.15 | 1.9 | A | A | B |
|  | 16 | MgO | 15 | 0.3 | 1.9 | A | B | B |
|  | 17 | MgO | 15 | 0.5 | 1.9 | A | C | C |
|  | 18 | MgO | 15 | 0.15 | 1.85 | A | B | B |
|  | 19 | MgO | 15 | 0.15 | 1.95 | A | A | A |
|  | 20 | MgO | 15 | 0.15 | 2 | A | B | C |
|  | 21 | MgO | 15 | 0.15 | 1.8 | A | D | C |
| Comparative | 6 | MgO | 5 | 0.15 | 1.9 | C | D | D |
| Examples | 7 | MgO | 15 | 0.6 | 1.9 | A | D | D |

As is understood from Table 1, when the average thickness of the intermediate layer is from 10 nm to 20 nm, and the surface roughness Ra is 0.5 nm or less, all of the film formation state, the reaction suppression state, and the superconducting properties are superior, in comparison with cases in which these conditions are not satisfied. Therefore, the combination of an average thickness of the intermediate layer of from 10 nm to 20 nm and a surface roughness Ra of 0.5 nm or less is preferable.

In addition, when CeO$_2$ is used as the material of the intermediate layer, an average valence of from 3.7 to 3.95 provides superior film formation state, superior reaction suppression state, and high superconducting properties, in comparison with cases in which the above conditions are not satisfied. Therefore, an average valence of from 3.7 to 3.95 in the case of using CeO$_2$ as the material of the intermediate layer is more preferable. When MgO is used as the material of the intermediate layer, an average valence of from 1.85 to 1.95 provides superior film formation state, superior reaction suppression state, and high superconducting properties, in comparison with cases in which the above conditions are not satisfied. Therefore, an average valence of from 1.85 to 1.95 in the case of using MgO as the material of the intermediate layer is more preferable.

Reference Example 1

An oxide superconducting thin film and a thin-film superconducting element were prepared in the same manner as in Example 1, except that the thickness of the intermediate layer (cerium oxide thin film) was changed to 40 nm.

First, the obtained intermediate layer (cerium oxide thin film) was examined using X-ray diffraction and an X-ray pole figure, as a result of which the cerium oxide was found to be oriented in a (001) orientation, and other orientation components were not observed.

In addition, the morphology of the obtained intermediate layer (cerium oxide thin film) was observed using AFM, as a result of which the surface was found to be very smooth, and holes that reached the sapphire substrate was not observed. The surface roughness Ra was 0.3 nm.

Further, the valence of cerium in the obtained intermediate layer (cerium oxide thin film) was examined using XPS, and the valence (average value of the valence as weighed by abundance) was 3.9. In the XPS, signals of Al were not detected. This confirms that the surface of the sapphire substrate was entirely covered with cerium oxide.

The critical current density (Jc) distribution of the oxide superconducting thin film at the liquid nitrogen temperature was measured by an induction method using CRYOSCAN manufactured by THEVA, and an even distribution of from 2.2 MA/cm$^2$ to 2.5 MA/cm$^2$ in the plane was obtained.

The critical current (Ic) of the obtained thin-film superconducting element was measured by an electric current test, and the Ic value was found to be 90 A.

Reference Example 2

An oxide superconducting thin film and a thin-film superconducting element were prepared in the same manner as in Reference Example 1, except that the temperature of the post-annealing was changed to 700° C.

First, the obtained intermediate layer (cerium oxide thin film) was examined using X-ray diffraction and an X-ray pole figure, as a result of which the cerium oxide was found to be oriented in a (001) orientation, and other orientation components were not observed.

In addition, the morphology of the obtained intermediate layer (cerium oxide thin film) was observed using AFM, and the surface was found to be very smooth, and holes that reached the sapphire substrate were not observed. The surface roughness Ra was 0.55 nm.

Further, the valence of cerium in the obtained intermediate layer (cerium oxide thin film) was examined using XPS, and the valence (average value of the valence as weighed by abundance) was 3.9. In the XPS, signals of Al were not detected. This confirms that the surface of the sapphire substrate was entirely covered with cerium oxide.

The critical current density (Jc) distribution of the oxide superconducting thin film at the liquid nitrogen temperature was measured by an induction method using CRYOSCAN manufactured by THEVA, and an even distribution of from 2.0 MA/cm² to 2.4 MA/cm² in the plane was obtained.

The critical current (Ic) of the obtained thin-film superconducting element was measured by an electric current test, and the Ic value was found to be 80 A.

TABLE 2

| | | Intermediate layer | | | Evaluation | | |
|---|---|---|---|---|---|---|---|
| | Material | Average thickness (nm) | Surface roughness Ra (nm) | Average valence | Film formation state | Reaction suppression state | Superconducting properties |
| Reference Examples | 1 CeO₂ | 40 | 0.3 | 3.9 | A | A | B |
| | 2 CeO₂ | 40 | 0.55 | 3.9 | A | A | B |

EXPLANATION OF REFERENCES

10 Superconducting fault current limiter
12 Sealed container
16 Electric current in/out unit
24 Element housing container
30 Thin-film superconducting element (Superconducting fault current limiting element)
32 Substrate
34 Intermediate layer
36A Precursor film
36 Superconducting layer
40 Electrode
100 Oxide superconducting thin film

The invention claimed is:

1. An oxide superconducting thin film, comprising a substrate, an intermediate layer provided on the substrate, and a superconducting layer provided on the intermediate layer, wherein
the intermediate layer comprises an average thickness from 10 nm to 20 nm and a surface roughness Ra of 0.5 nm or less,
the intermediate layer includes MgO with an NaCl-type crystal structure or $CeO_2$,
an average value of a valence of the Ce element in the $CeO_2$ as weighed by abundance is from 3.7 to 3.95,
an average value of a valence of the Mg element in the MgO as weighed by abundance is from 1.85 to 1.95, and
the superconducting layer is formed on a surface of the intermediate layer and includes an oxide superconductor as a main component.

2. An oxide superconducting thin film, comprising a substrate, an intermediate layer provided on the substrate, and a superconducting layer provided on the intermediate layer, wherein
the intermediate layer comprises an average thickness from 10 nm to 20 nm and a surface roughness Ra of 0.5 nm or less,
the intermediate layer includes MgO with an NaCl-type crystal structure,
an average value of a valence of the Mg element as weighed by abundance is from 1.85 to 1.95, and
the superconducting layer is formed on a surface of the intermediate layer and includes an oxide superconductor as a main component.

3. The oxide superconducting thin film according to claim 1, wherein the intermediate layer is provided on a surface of the substrate, and the substrate includes, at an interface between the substrate and the intermediate layer, a portion in which dislocation occurs.

4. The oxide superconducting thin film according to claim 1, wherein the oxide superconductor is represented by a compositional formula $REBa_2Cu_3O_{7-\delta}$ wherein RE represents a single rare earth element or a plurality of rare earth elements, and δ represents an oxygen non-stoichiometric amount.

5. The oxide superconducting thin film according to any claim 1, wherein the substrate is a sapphire substrate.

6. A superconducting fault current limiter, comprising:
a sealed container into which liquid nitrogen is filled into;
an electric current in/out unit through which an electric current flows from outside the sealed container to inside the sealed container or from inside the sealed container to outside the sealed container; and
a superconducting fault current limiting element including the superconducting layer of the oxide superconducting thin film of claim 1 and electrodes formed on the superconducting layer, the superconducting fault current limiting element being connected to the electric current in/out unit in the sealed container.

7. The oxide superconducting thin film according to claim 1, wherein the intermediate layer is provided on a surface of the substrate, and the substrate includes, at an interface between the substrate and the intermediate layer, a portion in which dislocation occurs.

8. The oxide superconducting thin film according to claim 2, wherein the intermediate layer is provided on a surface of the substrate, and the substrate includes, at an interface between the substrate and the intermediate layer, a portion in which dislocation occurs.

9. The oxide superconducting thin film according to claim 1, wherein the oxide superconductor is represented by a compositional formula $REBa_2Cu_3O_{7-\delta}$, wherein RE represents a single rare earth element or a plurality of rare earth elements, and δ represents an oxygen non-stoichiometric amount.

10. The oxide superconducting thin film according to claim 2, wherein the oxide superconductor is represented by a compositional formula $REBa_2Cu_3O_{7-\delta}$, wherein RE represents a single rare earth element or a plurality of rare earth elements, and δ represents an oxygen non-stoichiometric amount.

11. The oxide superconducting thin film according to claim 1, wherein the substrate is a sapphire substrate.

12. The oxide superconducting thin film according to claim 2, wherein the substrate is a sapphire substrate.

13. The superconducting fault current limiter according to claim 6, wherein the intermediate layer includes $CeO_2$, and an average value of a valence of the Ce element as weighed by abundance is from 3.7 to 3.95.

14. The superconducting fault current limiter according to claim 6, wherein the intermediate layer is provided on a surface of the substrate, and the substrate includes, at an interface between the substrate and the intermediate layer, a portion in which dislocation occurs.

15. The superconducting fault current limiter according to claim 6, wherein the oxide superconductor is represented by a compositional formula $REBa_2Cu_3O_{7-\delta}$, wherein RE represents a single rare earth element or a plurality of rare earth elements, and δ represents an oxygen non-stoichiometric amount.

16. The superconducting fault current limiter according to claim 6, wherein the substrate is a sapphire substrate.

\* \* \* \* \*